United States Patent

Baumgärtl

[19]

[11] Patent Number: 6,005,393
[45] Date of Patent: Dec. 21, 1999

[54] METHOD OF DETERMINING AN EARTH-FAULT CURRENT

[75] Inventor: Ulrich Baumgärtl, Berlin, Germany

[73] Assignee: Siemens Aktiengesellschaft, Munich, Germany

[21] Appl. No.: 08/894,192

[22] PCT Filed: Feb. 9, 1996

[86] PCT No.: PCT/DE96/00255

§ 371 Date: Dec. 18, 1997

§ 102(e) Date: Dec. 18, 1997

[87] PCT Pub. No.: WO96/25671

PCT Pub. Date: Aug. 22, 1996

[30] Foreign Application Priority Data

Feb. 15, 1995 [DE] Germany ............. 195 06 860

[51] Int. Cl.$^6$ .............. G01R 31/14; H02H 3/16
[52] U.S. Cl. .............. 324/509; 324/510; 361/44
[58] Field of Search .............. 324/509, 510, 324/511, 522, 545, 546, 547, 107, 127; 361/42, 44, 45, 46, 47, 48, 49, 50

[56] References Cited

U.S. PATENT DOCUMENTS 5,195,009 3/1993 May .............. 361/44

FOREIGN PATENT DOCUMENTS 0 407 310 1/1991 European Pat. Off. .

*Primary Examiner*—Diep N. Do
*Attorney, Agent, or Firm*—Kenyon & Kenyon

[57] ABSTRACT

A method of determining the ground-fault current flowing in a multi-phase circuit is based on the use of standard current transformers having iron cores for the phase conductors and the neutral conductor. Allowance is made for the current-dependant linearity error of the current transformers by subtracting the product of the highest phase-current and associated error from the vectorial sum of the currents. This results in a single-sided position of the tolerance band of the measured ground-fault current and prevents spurious tripping.

3 Claims, 2 Drawing Sheets

METHOD OF DETERMINING AN EARTH-FAULT CURRENT

BACKGROUND INFORMATION

The present invention is directed to a method of determining a ground-fault current in a multi-phase system by performing a vectorial summation of the output signals of each current transformer allocated to each phase of the system and of a neutral conductor.

European Published Patent Application 0 407 310 B1 requires the use of current transformers having great accuracy. Spurious tripping can occur if this requirement is not satisfied. For instance, if the ground-fault trip is to occur at 20% of the nominal current and increases by 5% when there is a fault in the transformer, then the measured ground current at 4-times nominal phase current has a fault of 100%. According to this reference, spurious tripping can only be avoided by employing current transformers that have great accuracy, but such transformers are heavy and require more space for installation. Space is limited because modern circuit breakers also place great value on compact dimensions.

Other methods for determining a ground fault current comprise specific features in terms of the requirements placed on the current transformers. In particular, ground currents can be measured directly, and this can be done by a ground transformer in the transformer neutral point or by a summation current transformer; this method is shown in U.S. Pat. No. 5,195,009. An obstacle to the high accuracy of such measuring methods can be increased complexity or conflicts with the system configuration.

SUMMARY OF THE INVENTION

An object of the present invention is to determine a ground-fault current in a multi-phase system by, first, using relatively inexpensive current transformers, and second, avoiding spurious tripping in order to achieve a certain level of operational reliability in the equipment to be protected.

This object is achieved by decreasing the vectorial sum of the current formed from the phase currents and the current of the neutral conductor by the product of the greatest current measured at the same point in time that flows in one of the phases or in the neutral conductor and the linearity error of the current transformer used.

This approach does not eliminate the measuring error of the ground current, but rather limits its effect by forming a single-sided tolerance band. This prevents spurious tripping caused by the measuring errors of the current transformers. The outlay required to realize the invention is slight in comparison to using current transformers having greater accuracy. The new method is equally suitable for current transformers having iron cores and for air-core transformers having a great dynamic range.

The object of the present invention can be achieved advantageously using a non-volatile memory for storing the linearity error of all current transformers used as a percentage. In order to achieve this object, it is not necessary to examine the linearity error of each current transformer individually. Rather, it is sufficient if the linearity error of the current transformer is determined and stored as a percentage quantity with respect each type of current transformer used.

DETAILED DESCRIPTION

Figure 1:
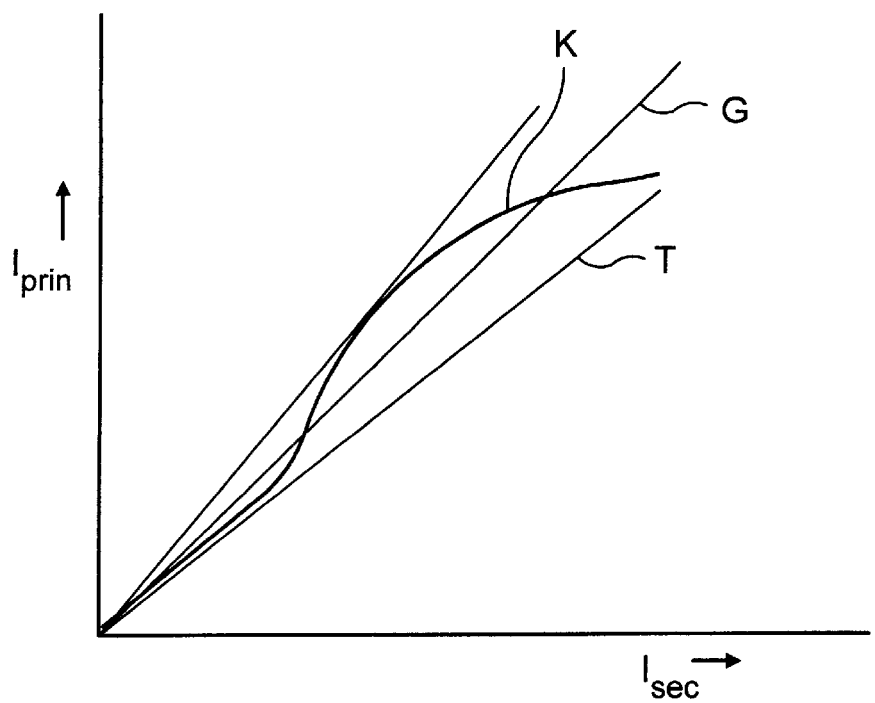
FIG. 1 illustrates an example of the curve of the linearity error of a current transformer as a function of the current level and the associated tolerance band.

In FIG. 1, the straight line G represents the linear transfer of a primary current $I_{prim}$ into a secondary current $I_{sec}$ as effected by an ideal current transformer. In contrast, the relationship is in reality non-linear and correlates to the curve K. This means that the measurement values are sometimes less than and sometimes greater than the correct value, depending on the level of the primary current $I_{prim}$. The linearity error F is therefore a function of the current. This results in a tolerance band T having a percentage error F.

Figure 2:
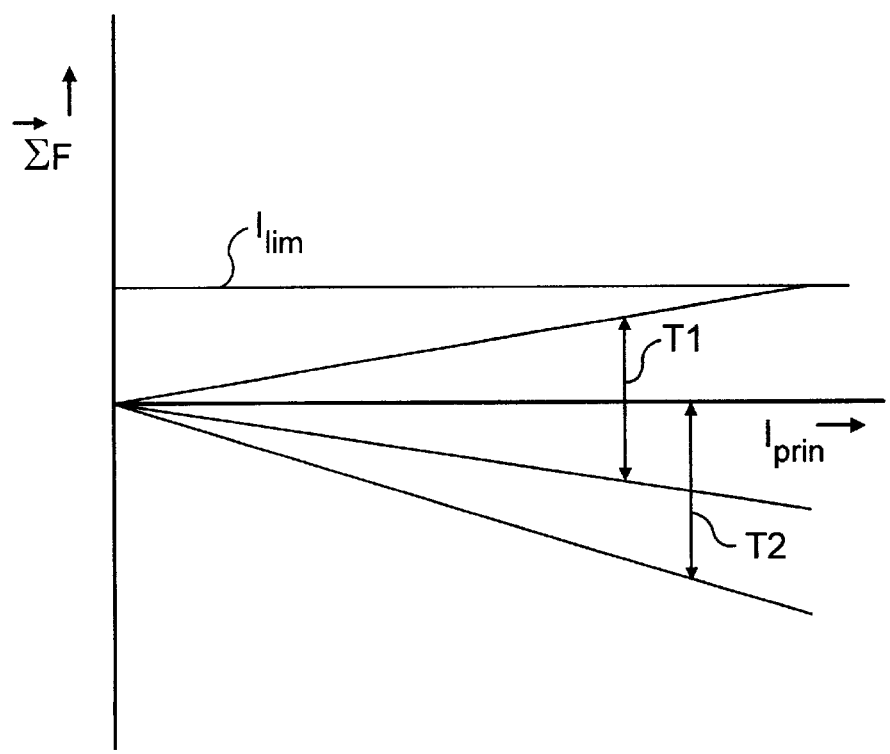
FIG. 2 illustrates two tolerance bands of the vectorial error sum over the primary current.

In FIG. 2, the vectorial sum of the errors $\Sigma F$ is shown as a current value over the primary current $I_{prim}$. In this context, the tolerance band T1 correlates to a curve that occurs without special measures. As can be seen, it is therefore possible, based solely on the tolerance of the current transformer, to reach a limiting value $I_{lim}$ of the ground current that leads to tripping. By means of the method as provided in the invention, a corrected tolerance band T2 is produced in which spurious tripping is not possible. How the tolerance band T2 is produced is explained using FIG. 3.

Figure 3:
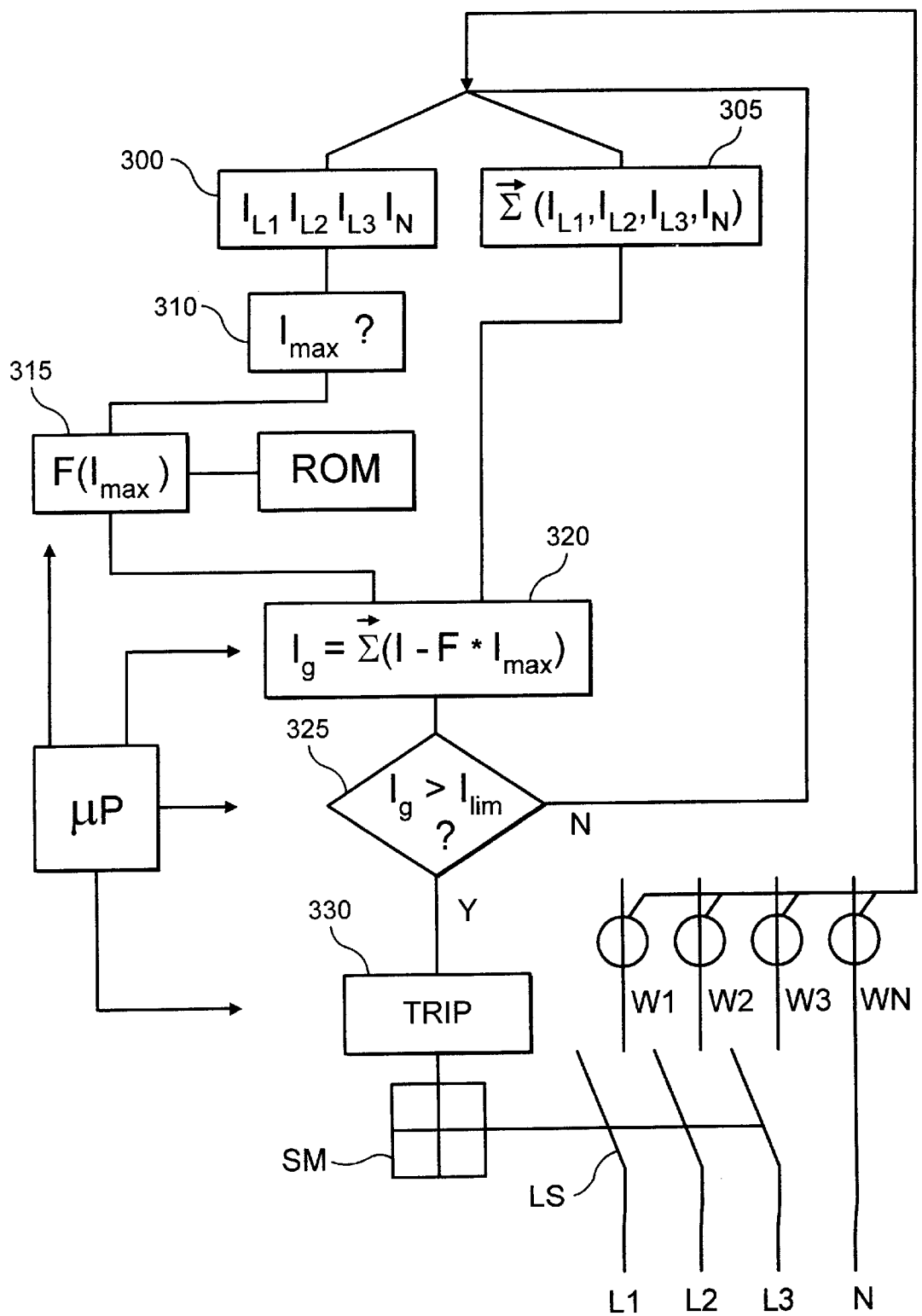
FIG. 3 illustrates a flow diagram and circuit diagram in accordance with the present invention.

Illustrated at the bottom of FIG. 3 is a circuit breaker LS, the switch contacts of which are arranged in line with the phase conductors L1, L2, and L3 of a three-phase system. Allocated to each of these conductors and a neutral conductor N is one current transformer W1, W2, W3, and WN. These current transformers are designed, in terms of the desired limited structural volume of the circuit breaker, in such a manner that errors correlating to the curve K in FIG. 1 can occur.

The circuit breaker LS comprises a switching mechanism, indicated by the symbol SM, that can be actuated by an electronic trip element. The electronic trip element is not shown in its entirety because in this context only a trigger based on a ground current is being considered. However, a microprocessor $\mu p$ is indicated; it controls the processes explained in the following.

The upper part of FIG. 3 constitutes a flowchart that illustrates the individual steps of the method of the present invention for measuring ground current. The method in accordance with the present invention begins when the measured values provided by the current transformers W1, W2, W3, and WN are read (step 300). In the branch on the left-hand side of the flowchart it is shown that the error $F(I_{max})$ associated with the highest current selected in step 310 from the measured values of the phase currents $I_{L1}$, $I_{L2}$, $I_{L3}$, and the current in the neutral conductor $I_N$ is read from an error table as a percentage value (step 315). The error table is maintained in a read-only memory ROM. An additional branch on the right-hand side of the flowchart illustrates the calculation of the vectorial sum of all currents measured $\Sigma(I_{L1}, I_{L2}, I_{L3}, I_N)$ (step 310).

Both of these above determined variables, i.e., $I_{max}$ and $\Sigma(I_{L1}, I_{L2}, I_{L3}, I_N)$, are now processed in a calculation process controlled by the microprocessor $\mu p$ in order to obtain the corrected ground current $I_g$ (step 320). The ground current $I_g$ is determined from the formula:

$$I_g = \Sigma(I_{L1}, I_{L2}, I_{L3}, I_N) - F^* I_{max}$$

Once a corrected value $I_g$ of the ground current is obtained, a comparison is conducted to determine whether $I_g$ is greater than or less than a limiting value $I_{lim}$ set by the user of the circuit breaker LS (step 325). If this condition is satisfied, the microprocessor μp causes through the block TRIP actuation of the switching mechanism SM and therefore opening of the switch contacts in line with the conductors L1, L2, and L3 (step 330).

In the above-described method, a single-sided tolerance band of the error is formed when measuring the ground current. As is illustrated in FIG. 2, unless there are special measures, there is a risk that the circuit breaker LS will be tripped, not because of the absolute level of the ground current, but rather because of the current-dependent error. As a result of correcting the measured value of the ground current, the error remains below the set threshold value for such a trip, even given high currents in the phase conductors.

What is claimed is:

1. A method of determining a ground-fault current in a multi-phase system, comprising:

determining a vectorial sum of a plurality of phase currents and a current of a neutral conductor measured at a point in time, each one of the phase currents and the current of the neutral conductor being associated with a corresponding one of a plurality of current transformers;

determining a product of (i) a highest one of the phase currents and of the current of the neutral conductor measured at the point in time and (ii) a linearity error associated with the highest one of the phase currents and of the current of the neutral conductor; and decreasing the vectorial sum by an amount equal to the determined product to determine the ground fault current.

2. The method according to claim 1, wherein each current transformer is associated with a corresponding linearity error, and wherein each linearity error is maintained in a non-volatile memory as a percentage.

3. The method according to claim 2, wherein each linearity error is determined and stored as a percentage quantity as a function of an associated one of a plurality of primary currents, each primary current corresponding to one of the plurality of current transformers.

* * * * *